(12) United States Patent
Liu et al.

(10) Patent No.: US 6,744,244 B2
(45) Date of Patent: Jun. 1, 2004

(54) VARIABLE IMPEDANCE NETWORK WITH COARSE AND FINE CONTROLS

(75) Inventors: Chun-Mai Liu, San Jose, CA (US); Hagop A. Nazarian, San Jose, CA (US)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 10/114,375

(22) Filed: Apr. 1, 2002

(65) Prior Publication Data

US 2003/0184312 A1 Oct. 2, 2003

(51) Int. Cl.[7] .................................................. H02J 3/12
(52) U.S. Cl. ........................ 323/354; 323/297; 323/298
(58) Field of Search ................................. 323/293, 297, 323/298, 352, 353, 354; 341/144–154

(56) References Cited

U.S. PATENT DOCUMENTS

| 4,468,607 A | 8/1984 | Tanaka et al. |
| 5,084,667 A | 1/1992 | Drori et al. |
| 5,831,566 A | * 11/1998 | Ginetti ........................ 341/144 |
| 6,552,519 B1 | * 4/2003 | Nazarian ..................... 323/354 |

* cited by examiner

*Primary Examiner*—Michael Sherry
*Assistant Examiner*—Gary L. Laxton
(74) *Attorney, Agent, or Firm*—Blakely, Sokoloff, Taylor & Zafman LLP

(57) ABSTRACT

An impedance network. The network includes a plurality of impedance elements, at least one end terminal, and a wiper terminal. The network also includes a first plurality of switching elements selectively providing tap positions to the at least one end terminal, selectable at a first specified increment of impedance elements in the plurality of impedance elements. The network further includes a second plurality of switching elements selectively providing a tap positions to the wiper terminal, selectable at a second specified increment of impedance elements in the plurality of impedance elements.

4 Claims, 9 Drawing Sheets

VARIABLE IMPEDANCE NETWORK WITH COARSE AND FINE CONTROLS

BACKGROUND

The present invention relates to a variable impedance network. More particularly, the invention relates to such a variable impedance network with coarse and fine controls.

Variable impedance networks are usually manually adjusted to provide a selected impedance so as to affect some aspect of the circuit in which the networks are located. These variable impedance networks are usually in the form of variable resistors, also called potentiometers. However, circuits using variable inductors or capacitors may also be formed.

Manual adjustment of potentiometers is usually undesirable in circuits under the control of data processing systems or other external electric circuits where ongoing adjustment of the potentiometer is necessary for circuit operation. The data processing system often must change the value of the variable impedance network in a time that is short relative to the time required to complete a manual adjustment of the variable impedance element. Therefore, special purpose integrated circuit variable impedance networks have been employed in the prior art. These networks allow the level of attenuation to be adjusted under the digital control of an external data processing system.

For example, Tanaka, et al., U.S. Pat. No. 4,468,607, teaches a ladder attenuator which is controlled by a binary number by means of a switch circuit. Depending on the stage of the switches in this switch circuit, one or more stages of attenuation are introduced into the signal path. However, teachings of Tanaka may require a large number of fixed impedance elements and switches for a large range of impedances. Accordingly, Drori, et al., U.S. Pat. No. 5,084,667, suggests a number of embodiments of variable impedance elements which minimizes the number of separate resistors required to achieve the equivalent resolution achievable using a series arrangement of resistors.

SUMMARY

The present invention, in one aspect, describes an impedance network. The network includes a plurality of impedance elements, at least one end terminal, and a wiper terminal. The network also includes a first plurality of switching elements selectively providing tap positions to the at least one end terminal, selectable at a first specified increment of impedance elements in the plurality of impedance elements. The network further includes a second plurality of switching elements selectively providing a tap positions to the wiper terminal, selectable at a second specified increment of impedance elements in the plurality of impedance elements.

In another aspect, the present invention describes a method for configuring an impedance network. The method includes providing a plurality of impedance elements, providing at least one end terminal and a wiper terminal, first selectively providing tap positions to the at least one end terminal, selectable at a first specified increment of impedance elements in the network, and second selectively providing a tap positions to the wiper terminal, selectable at a second specified increment of impedance elements in the network.

DETAILED DESCRIPTION

In recognition of the above-stated challenges associated with prior art designs of variable impedance networks, alternative embodiments for a variable impedance network, which reduces overhead circuits and enhances operation with coarse and fine controls, are described. The network and its associated control method use coarse and fine wiper control for building potentiometers and digital-to-analog converters (DACs). In this scheme, the wiper terminal and the two end terminals are allowed to be programmably movable. The wiper terminal is allowed to connect in fine steps in a section of the network. The two end terminals are switched together in coarse steps while maintaining a constant total resistance. Smooth transition between coarse step is made possible by turning the corresponding switches to end-terminals on and off in stages, a portion at a time. A significant reduction of chip area may be achieved with little or no degradation of chip performance. Consequently, for purposes of illustration and not for purposes of limitation, the exemplary embodiments of the invention are described in a manner consistent with such use, though clearly the invention is not so limited.

Figure 1A:
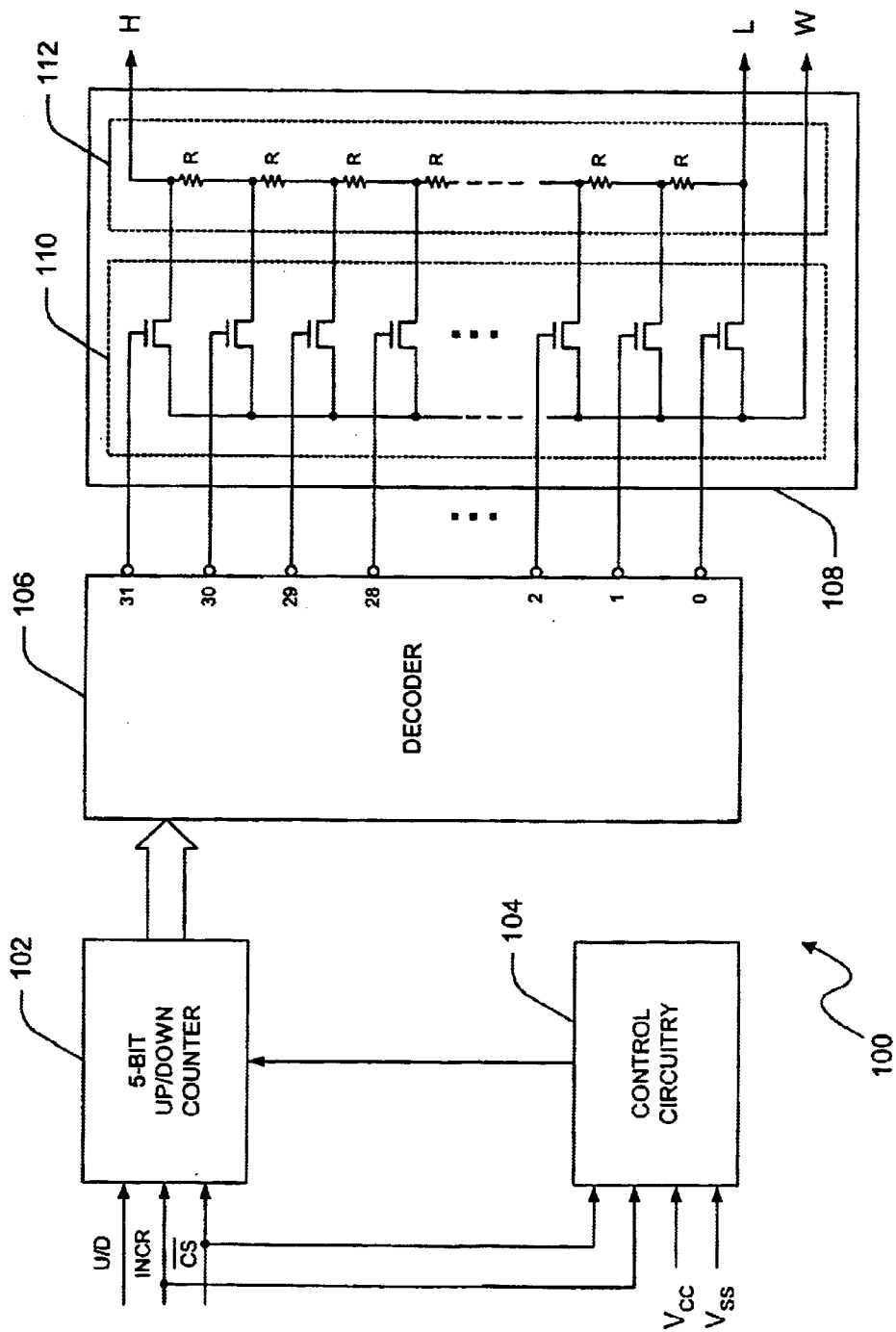
FIG. 1A shows a conventional variable resistance network.

A conventional variable resistance network 100 is illustrated in FIG. 1A. The network 100 includes a counter 102, a control circuitry 104, a decoder 106, and a network array 108 having a transistor array 110 and a resistor array 112. In the illustrated example, the network array 108 has three terminals, H, L and W. Hence, the network array 108 simulates a standard potentiometer 120, such as the one shown in FIG. 1B. Terminals H and L correspond to the end terminals, while terminal W corresponds to the center tap of the potentiometer 120.

In the illustrated example of FIG. 1A, the resistor array 112 includes 32 equal resistor elements (R) arranged in series to represent 32 tap positions at the wiper nodes of the potentiometer 120. However, any number of resistor elements may be used to provide smaller or larger resistance value than this example. The transistor array 110 includes wiper transistors that are used to connect various combinations of resistor elements between two terminals H and W.

The particular combination is determined by a value stored in a counter 102, which may be altered by two signals, U/D and INCR. The U/D signal determines whether the counter 102 will be incremented or decremented by a predetermined amount in response to the increment (INCR) signal. This value is coupled to a 1-of-N decoder 106, where N=32. The output of this decoder 106 controls the plurality of wiper transistors in the transistor array 110. Since N is the maximum value which may be stored in the counter 102, there are N nodes in the resistor array 112, each node corresponding to a given counter value. Each node may be coupled to terminal W by applying a signal to the corresponding wiper transistor in the transistor array 110.

The value stored in the counter 102 may be transferred to a memory in the control circuitry 104 in response to specified voltage transitions on a chip select (CS) line. The chip select line also enables the counter 102. When the chip select line is low, the counter 102 responds to signals on U/D and INCR lines. This enables the circuit controlling the variable resistance network 100 to alter the value stored in counter 102.

The control circuitry 104 also monitors supply voltages ($V_{cc}$ and $V_{ss}$) to load the value stored in the memory into the counter 102 when power is applied to the variable resistance network 100. This ensures that the last value stored in counter 102 before power was removed from the variable resistance network 100 will be restored when the power is once again applied to the variable resistance network 100.

Figure 1B:
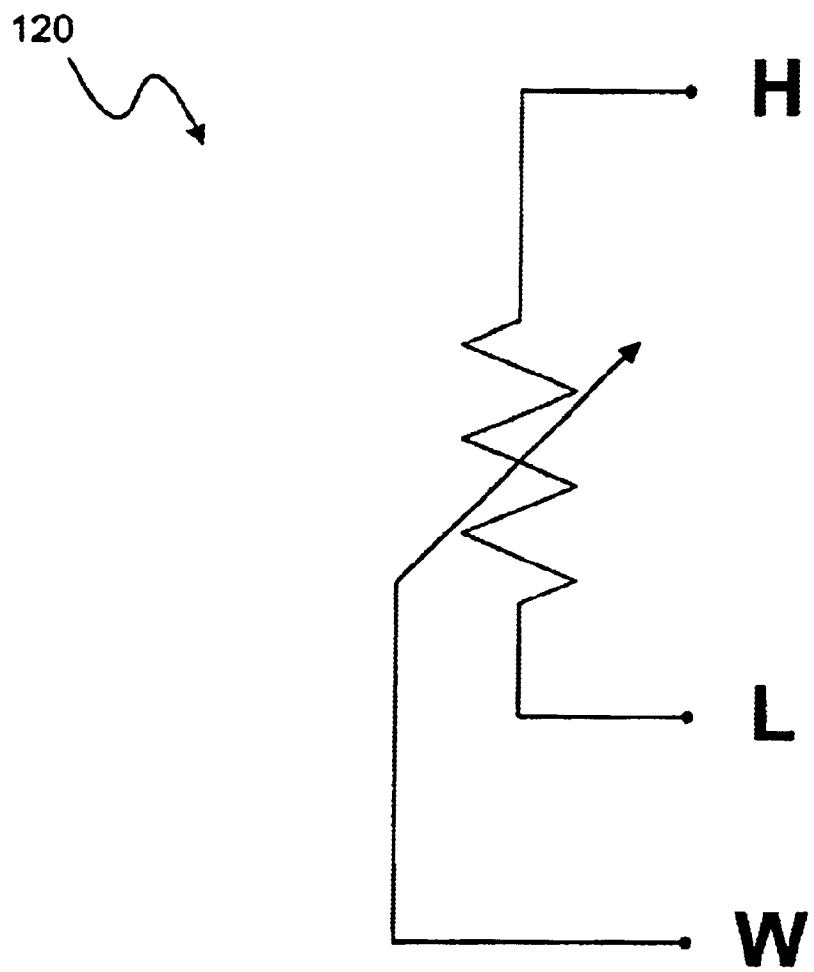
FIG. 1B shows a standard center-tapped potentiometer.

With the above-described approach illustrated in FIGS. 1A and 1B, N wiper transistors are required to generate N tap positions. Hence, when N becomes large (e.g., N>100), the area of the die occupied by the wiper transistors may significantly increase, especially when the specification for wiper resistance is low (i.e., 50 ohms or less).

Accordingly, the present embodiments include solutions to the above-stated undesirable outcome of large N by providing a variable impedance network which requires fewer wiper transistors. Moreover, the teachings of these embodiments may be extended to include impedance networks having elements other than resistors, such as capacitors or inductors. In the below-described embodiments, the impedance network is a binary numbering scheme assigned to a plurality of serially connected resistive pairs, where each pair is connected in parallel. However, in an alternative embodiment, more than two resistors may be configured in parallel arrangement to provide wider range of resistance values, and thus, further reduce the wiper transistor count. In a further embodiment, bypass transistors may be provided to bypass certain resistors. This may also provide wider range resistance values.

Figure 2A:
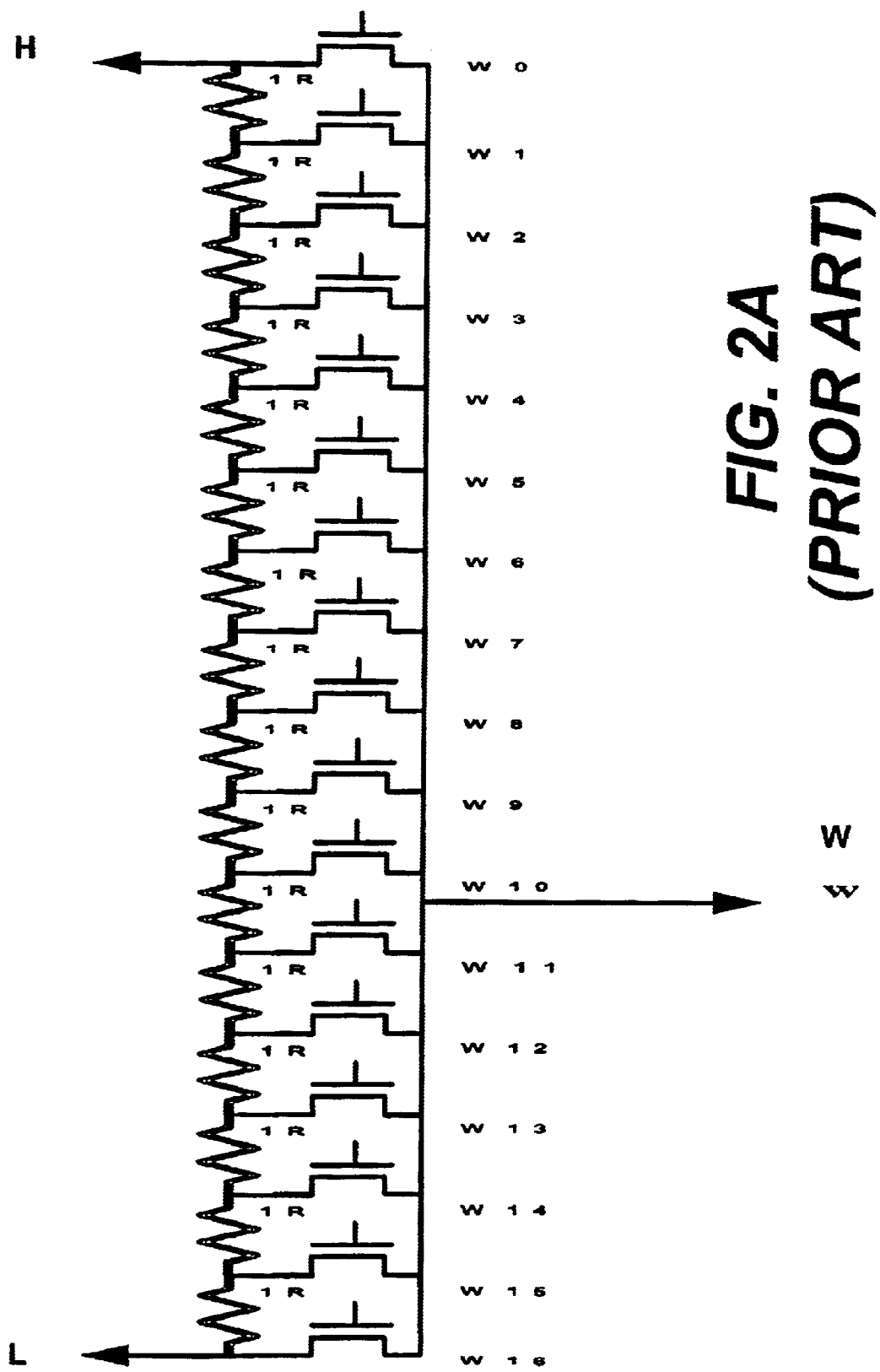
FIG. 2A shows another conventional variable resistance network.

In a conventional network shown in FIG. 2A, wiper contacts, labeled as "W", are brought out at every step, where each step represents the resistor element for the finest increment of resistance value. This configuration is substantially similar to the earlier conventional configuration 100 mentioned above. The end contacts, labeled as "H" and "L", are fixed in this configuration.

Figure 2B:
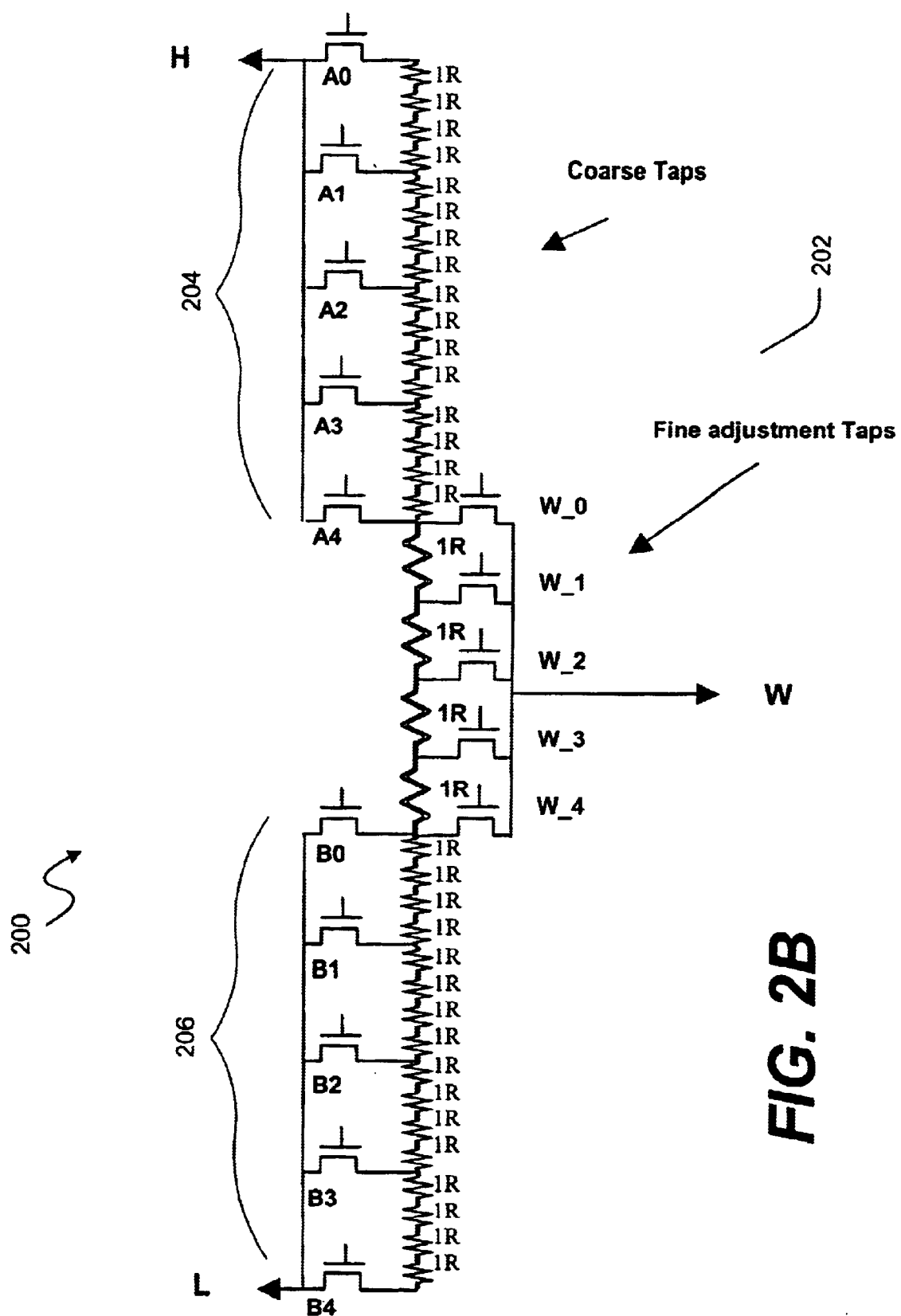
FIG. 2B illustrates a variable impedance network in accordance with an embodiment of the invention.

FIG. 2B illustrates a variable impedance network 200 in accordance with an embodiment of the invention. Hence, in FIG. 2B, the wiper contacts, labeled as "W", are brought out as "fine adjustment", for only one section 202 of the resistor string. To accommodate moving end contacts, the base string are lengthened to approximately twice the length required for fixed end contacts (i.e., two times the required length for fixed end contacts minus the length of the section of "wipers"). Then "H" end contacts are introduced (with a regularity of the length of the section of "wipers"), to the upper side 204 of the "wiper" section 202. And "L" end contacts are introduced (with regularity of the length of the section of "wipers"), to the lower side 206 of the "wiper" section 202. Pairs of "H" and "L" contacts may be selected, such that the resistances remain constant, and the "wiper" section 202 appears at the desired position. In this way, the "H"-"L" pair serves for range change and the "wiper" section 202 serves for fine adjustment.

For example, to program zero to 4R between H and wiper terminals, coarse tap switches A4 and B4 are activated, and fine tap switches, W0 to W4, are successively activated. To program 5R to 8R between H and wiper terminals, coarse tap switches A3 and B3 are activated, and fine tap switches, W0 to W4, are successively activated. To program 9R to 12R between H and wiper terminals, coarse tap switches A2 and B2 are activated, and fine tap switches, W0 to W4, are successively activated, and so on. Thus, it can be seen that resistance values at all increment steps may be programmed with a pair of coarse tap switches and a fine tap switch.

Figure 2C:
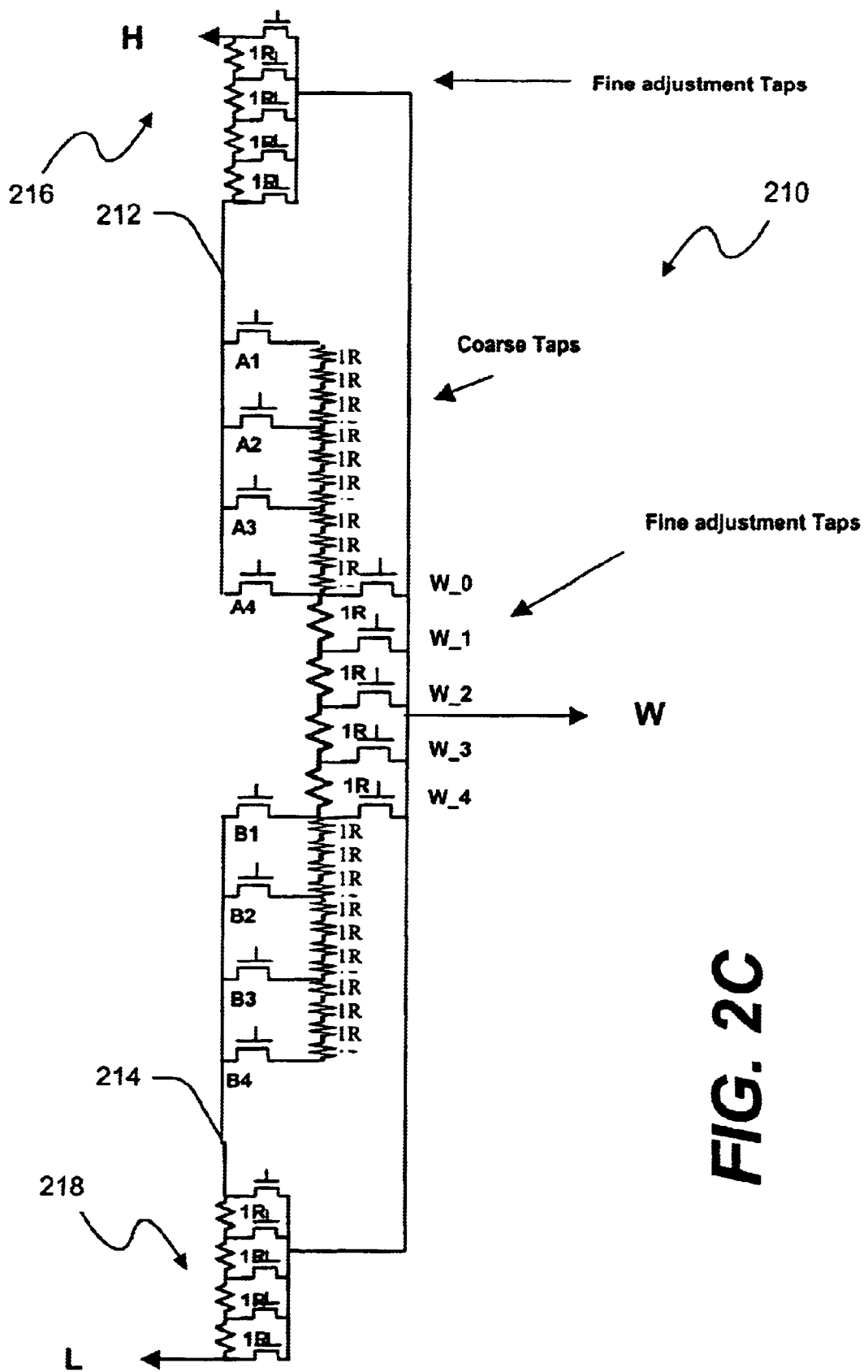
FIG. 2C illustrates a variable impedance network in accordance with an alternative embodiment of the invention.

FIG. 2C shows an alternative embodiment 210 of the coarse-fine resistance approach shown in FIG. 2B. In this embodiment, the coarse contact points (pass gates) 212, 214 are not connected to the end point. A pair of fine tap resistor networks 216, 218 is substituted for the two coarse resistance taps placed at the two ends of the network. This substantially reduces the direct connection of pass gates to the end points of the resistor network 210. This approach provides additional advantages to the network 210. This embodiment may allow the entire resistor network 210 to be configured into three different adjustment levels where the middle resistor network selected by wiper pass gates provides intermediate adjustment, the two resistor network adjacent to the middle resistor network provides coarse adjustment, and the resistor networks connected to the two end terminals provides fine adjustment.

Advantages of this alternative embodiment 210 over the network 200 shown in FIG. 2B include the fact that the network 210 produces less capacitance seen at the end terminals since the pass devices are not directly connected to the end terminals. Thus, less capacitive coupling is introduced into the end terminals while changing the coarse switches. Also, the wiper resistance at the end terminal nodes passes through a single pass device. Further, total network resistance characteristics such as Integral non-Linearity (INL) and differential non-linearity (DNL) may be designed to perform better with this type of network.

Figure 3:
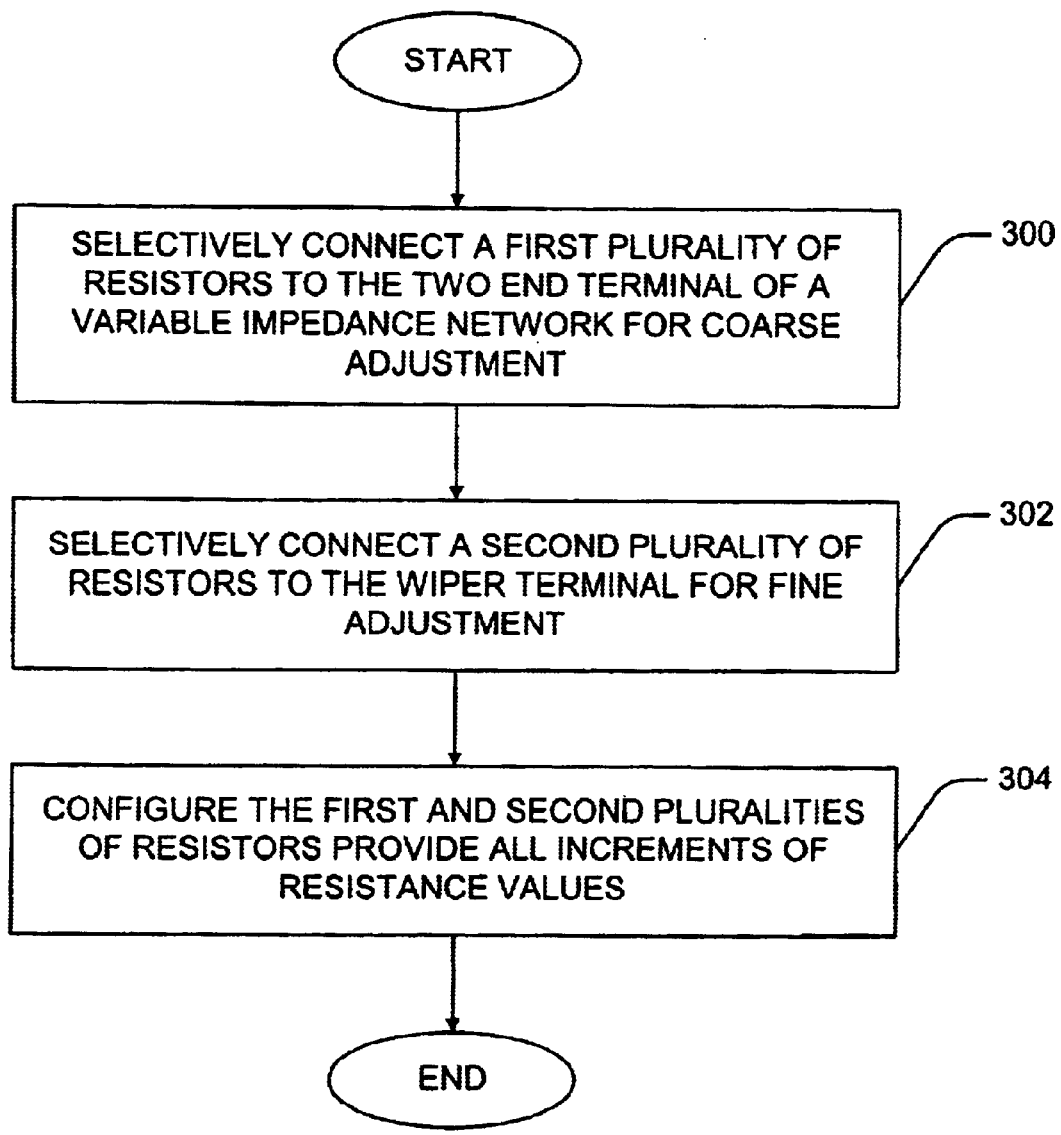
FIG. 3 illustrates a new method for configuring an impedance network array in accordance with an embodiment of the present invention.

A new method for configuring an impedance network array in accordance with an embodiment of the present invention is illustrated in FIG. 3. The method includes selectively connecting a first plurality of resistors to the two end terminals of a variable impedance network, at 300, for a coarse adjustment. At 302, a second plurality of resistive elements is selectively connected to the wiper terminal for fine adjustment. Furthermore, the first and second pluralities of resistors are configured to provide all increments of resistance value in the variable impedance network, at 304.

Advantages of the new approach over the conventional approach described above include reduction the number of wiper transfer gates. The conventional approach scales linearly with the number of taps. Hence, the conventional approach uses n+1 wiper/pass transistors for n needed taps. The new approach described in conjunction with FIGS. 2B and 4C scales with the number of taps as a function of square root. Therefore, this approach uses $3*\sqrt{n}$ pass/wiper transistors for n needed taps. Other advantages include the ability to tap directly into the resistor string without any additional resistance seen from the wiper terminal, other than that from the wiper pass gate. Furthermore, there are at most two additional pass gates between the two end terminals during operation. Another possible advantage is that the effective parasitic capacitance induced by the pass gates is reduced, since the number of the pass gates is far less then the conventional approach. This increases the frequency response of the potentiometer.

The new approach presents some disadvantages including having to use approximately 2 times more unit size resistors than the conventional method. However, since the unit resistors are not the major area contributor to the die size, the impact of this increase in the number of unit size resistors may be overcome by the reduction of the pass/wiper transistor overhead, especially for potentiometers with large number of taps.

While specific embodiments of the invention have been illustrated and described, such descriptions have been for purposes of illustration only and not by way of limitation. Accordingly, throughout this detailed description, for the purposes of explanation, numerous specific details were set forth in order to provide a thorough understanding of the present invention. It will be apparent, however, to one skilled in the art that the embodiments may be practiced without some of these specific details. In other instances, well-known structures and functions were not described in elaborate detail in order to avoid obscuring the subject matter of the present invention. Accordingly, the scope and spirit of the invention should be judged in terms of the claims which follow.

Appendix

The new resistive network that was constructed uses a fine and coarse scheme by shifting the end terminals together in coarse steps and by changing the wiper terminal in fine steps, the conventional manner.

1. Network Architecture

Figure 4:
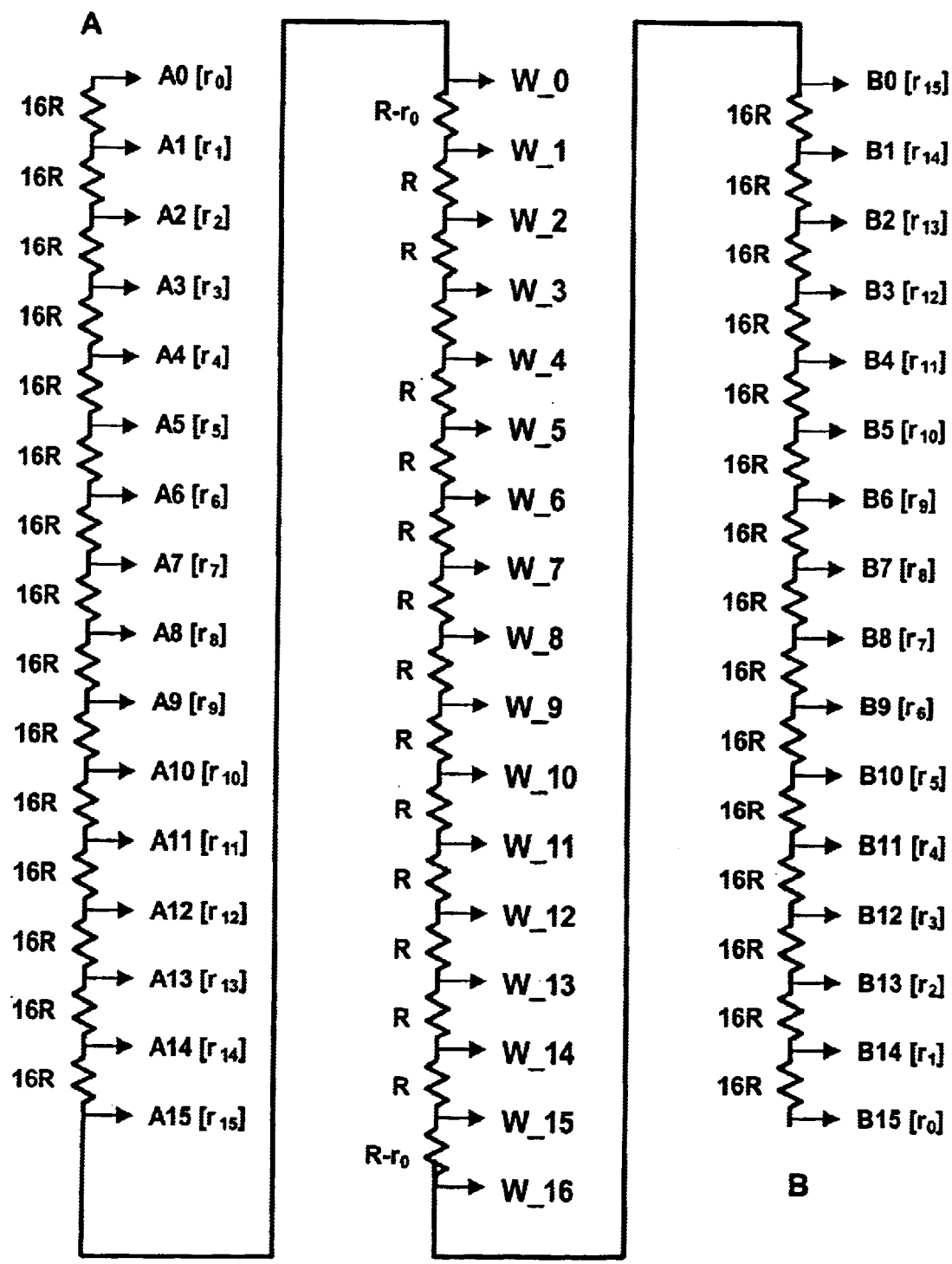
FIG. 4 depicts one embodiment of the network schematic of the new concept, dubbed "A-W-B" as implemented for a potentiometer with 256 equally discernible steps.

FIG. 4 depicts one embodiment of the network schematic of the new concept, dubbed "A-W-B" as implemented for a potentiometer with 256 equally discernible steps. With R as the unit resistance, the total resistance of the string is 256R and the wiper is supposed to tap into the string in multiple of the unit, resistance. The resistor string includes three sections: the top (A) section—the section of moving "A" ends; the middle (W) section—the section of moving wipers; and the bottom (B) section—the section of moving "B" ends. Each section is described in detail below.

In the left (A or the top) section, there are fifteen resistor segments of equal resistance (16R each) and sixteen tapping points, between these resistor segments, labeled A0 to A15. From these tapping points, connections to the A-end terminal may be made. Specifically, the A0 tapping point is hard-wired to the A-end terminal via resistor $r_0$. For the group of A1 to A15 tapping points, a switch is (not drawn) placed between each tapping point and the A-end, and with its resistance symbolized in a pair of square brackets such as $[r_x]$. The resistances of these switches are part of the overall path resistances are denoted symbolically as $r_1, \ldots, r_{15}$. Thus, A4 $[r_4]$ in FIG. 4 reads "tapping point A4 of Section A with a switch of resistance $r_4$, connecting to A-end terminal".

In the center (W or the middle) section, there are fourteen resistor segments of equal resistance (R), and two end resistor segments with resistance of (R-$r_0$), and seventeen tapping points, between these resistor segments, labeled W_0 to W_16. A switch (not drawn) is placed between each tapping point and the wiper terminal. From these tapping points, connections to the wiper W terminal may be made.

In the right (B or the bottom) section, there are fifteen resistor segments of equal resistance (16R each) and sixteen tapping points, between these resistor segments, labeled B0 to B15. From these tapping points, connections to the B-end terminal may be made. Specifically, the B15 tapping point is hard-wired to the B-end terminal via resistor $r_0$. For the group of B0 to B14 tapping points, a switch (not drawn) is placed between each tapping point and the B-end, and with its resistance symbolized in a pair of square brackets such as $[r_x]$. The resistances of these switches are part of the overall path resistances are denoted symbolically as $r_{15}, \ldots, r_1$.

This network is constructed to meet two major constraints. The first constraint is that the end-to-end resistance of the potentiometer should remain constant. The second constraint is that all possible taps need to be generated at the wiper node (variable node of the potentiometer).

To accomplish the end-to-end constraints the A and B terminal sections are mirrored symmetrically with each other around the center wiper section so that the resistance between $V_A$ and $V_W$ is set to the desired value of x times R by selecting the appropriate switches and the end-to-end resistance between $V_A$ and $V_B$ constant to 256R.

In addition to the resistors, $r_1$ to $r_{15}$, representing the switches, the resistors (R-$r_0$) and $r_0$ are introduced for compensating the effect of non-zero switch resistance. Depending on the operating scheme used, the values of r, $r_0$, $r_1$ to $r_{15}$ may be calculated so that the "correct" voltages appear at the wiper contacts. The circuit elements and the connections required for the functioning of a potentiometer with 256 steps are summarized in Table 1 as follows:

TABLE 1

The Circuit Elements and Connections for the Network

| Tapping point | Circuit Element | Connection to | Tapping point | Circuit Element [a] | Connecting to | Tapping point. | Circuit Element | Connection to |
|---|---|---|---|---|---|---|---|---|
| A0 | Resistor, r = $r_0$ | A-end | W_0 | Resistor $r_0$ | W-end | B0 | Switch, r-on = $r_{15}$ | B-end |
| A1 | Switch, r-on = $r_1$ | A-end | W_1 | Switch, r-on = $r_w$ | W-end | B1 | Switch, r-on = $r_{14}$ | B-end |
| A2 | Switch, r-on = $r_2$ | A-end | W_2 | Switch, r-on = $r_w$ | W-end | B2 | Switch, r-on = $r_{13}$ | B-end |
| A3 | Switch, r-on = $r_3$ | A-end | W_3 | Switch, r-on = $r_w$ | W-end | B3 | Switch, r-on = $r_{12}$ | B-end |
| A4 | Switch, r-on = $r_4$ | A-end | W_4 | Switch, r-on = $r_w$ | W-end | B4 | Switch, r-on = $r_{11}$ | B-end |
| A5 | Switch, r-on = $r_5$ | A-end | W_5 | Switch, r-on = $r_w$ | W-end | B5 | Switch, r-on = $r_{10}$ | B-end |
| A6 | Switch, r-on = $r_6$ | A-end | W_6 | Switch, r-on = $r_w$ | W-end | B6 | Switch, r-on = $r_9$ | B-end |
| A7 | Switch, r-on = $r_7$ | A-end | W_7 | Switch, r-on = $r_w$ | W-end | B7 | Switch, r-on = $r_8$ | B-end |
| A8 | Switch, r-on = $r_8$ | A-end | W_8 | Switch, r-on = $r_w$ | W-end | B8 | Switch, r-on = $r_7$ | B-end |
| A9 | Switch, r-on = $r_9$ | A-end | W_9 | Switch, r-on = $r_w$ | W-end | B9 | Switch, r-on = $r_6$ | B-end |
| A10 | Switch, r-on = $r_{10}$ | A-end | W_10 | Switch, r-on = $r_w$ | W-end | B10 | Switch, r-on = $r_5$ | B-end |
| A11 | Switch, r-on = $r_{11}$ | A-end | W_11 | Switch, r-on = $r_w$ | W-end | B11 | Switch, r-on = $r_4$ | B-end |
| A12 | Switch, r-on = $r_{12}$ | A-end | W_12 | Switch, r-on = $r_w$ | W-end | B12 | Switch, r-on = $r_3$ | B-end |
| A13 | Switch, r-on = $r_{13}$ | A-end | W_13 | Switch, r-on = $r_w$ | W-end | B13 | Switch, r-on = $r_2$ | B-end |
| A14 | Switch, r-on = $r_{14}$ | A-end | W_14 | Switch, r-on = $r_w$ | W-end | B14 | Switch, r-on = $r_1$ | B-end |
| A15 | Switch, r-on = $r_{15}$ | A-end | W_15 | Switch, r-on = $r_w$ | W-end | B15 | Switch, r-on = $r_0$ | B-end |
| | | | W_16 | Switch, r-on = $r_w$ | W-end | | | |

[a] $r_w$ can be set equal to $r_0$ or some other values depending on the system spec.

2. Operation Scheme

To set the wiper to a particular step, a pair of "A" and "B" tapping points is selected first, such that "wiper" section falls within the appropriate range. Then, the wiper contact is set to a specific "W" tapping point. Using the example of a potentiometer with 256 steps, as depicted in FIG. 2B, the operation scheme may best be described in a table form. Table 2 shows how the A-B pairs should be selected as a function of Wiper Step Number. The Wiper Step Number is the resistance in unit of R between terminal W and B-end.

TABLE 2

The Selection of A-End and B-End tapping points vs. Wiper Step Numbers

| Wiper Step No. | A Section tapping points | | | | | | | | | | | | | | | |
|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 |
| 1  1–16 | y | | | | | | | | | | | | | | | |
| 17–32 | y | y | | | | | | | | | | | | | | |
| 33–48 | y | | y | | | | | | | | | | | | | |
| 49–64 | y | | | y | | | | | | | | | | | | |
| 65–80 | y | | | | y | | | | | | | | | | | |
| 81–96 | y | | | | | y | | | | | | | | | | |
| 97–112 | y | | | | | | y | | | | | | | | | |
| 113–128 | y | | | | | | | y | | | | | | | | |
| 129–144 | y | | | | | | | | y | | | | | | | |
| 145–160 | y | | | | | | | | | y | | | | | | |
| 161–176 | y | | | | | | | | | | y | | | | | |
| 177–192 | y | | | | | | | | | | | y | | | | |
| 193–208 | y | | | | | | | | | | | | y | | | |
| 209–224 | y | | | | | | | | | | | | | y | | |
| 225–240 | y | | | | | | | | | | | | | | y | |
| 241–256 | y | | | | | | | | | | | | | | | y |

| Wiper Step No. | B Section tapping points | | | | | | | | | | | | | | | |
|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 |
| 1  1–16 | y | | | | | | | | | | | | | | | y |
| 17–32 | | y | | | | | | | | | | | | | | y |
| 33–48 | | | y | | | | | | | | | | | | | y |
| 49–64 | | | | y | | | | | | | | | | | | y |
| 65–80 | | | | | y | | | | | | | | | | | y |
| 81–96 | | | | | | y | | | | | | | | | | y |
| 97–112 | | | | | | | y | | | | | | | | | y |
| 113–128 | | | | | | | | y | | | | | | | | y |
| 129–144 | | | | | | | | | y | | | | | | | y |
| 145–160 | | | | | | | | | | y | | | | | | y |
| 161–176 | | | | | | | | | | | y | | | | | y |
| 177–192 | | | | | | | | | | | | y | | | | y |
| 193–208 | | | | | | | | | | | | | y | | | y |
| 209–224 | | | | | | | | | | | | | | y | | y |
| 225–240 | | | | | | | | | | | | | | | y | y |
| 241–256 | | | | | | | | | | | | | | | | y |

"y" means the connection to A-end or to B-end is selected (switch is on)

The first column with heading "Wiper Step No." indicates the groups (in rows) of steps (by their numbers) that can be accessed by the Wiper terminal. The corresponding A-end and B-end terminals are given for each row in columns 2 and 3, respectively. For instance, the group of steps 49 to 64 may be accessed, when fixed contacts A0, B15, and the moving contact pair A3-B3 are selected. The specific step selection depends on the "wiper" contact setting. Table 3 shows how the tapping points in W section should be selected as a function of Local Wiper Step Number. The Local Wiper Step Number is the resistance in unit of R between terminal W and the end of W-section in the direction of B-end.

TABLE 3

The Selection of W tapping points vs. Local Wiper Step Numbers

| Local WS No. | W Section tapping points | | | | | | | | | | | | | | | | | Accessible Wiper Step No. |
|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | |
| 1 | | | | | | | | | | | | | | | y | | | 1, 17, 33, 49, 65, 81, 97, 113, 129, 145, 161, 177, 193, 209, 225, 241 |

TABLE 3-continued

The Selection of W tapping points vs. Local Wiper Step Numbers

| Local WS No. | 0 | 1 | 2 | 3 | 4 | 5 | 6 | 7 | 8 | 9 | 10 | 11 | 12 | 13 | 14 | 15 | 16 | Accessible Wiper Step No. |
|---|---|---|---|---|---|---|---|---|---|---|---|---|---|---|---|---|---|---|
| 2 |  | y |  |  |  |  |  |  |  |  |  |  |  | y |  |  |  | 2, 18, 34, 50, 66, 82, 98, 114, 130, 146, 162, 178, 194, 210, 226, 242 |
| 3 |  |  |  |  |  |  |  |  |  |  |  |  |  |  | y |  |  | 3, 19, 35, 51, 67, 83, 99, 115, 131, 147, 163, 179, 195, 211, 227, 243 |
| 4 |  |  |  |  |  |  |  |  |  |  |  |  | y |  |  |  |  | 4, 20, 36, 52, 68, 84, 100, 116, 132, 148, 164, 180, 196, 212, 228, 244 |
| 5 |  |  |  |  |  |  |  |  |  |  |  | y |  |  |  |  |  | 5, 21, 37, 53, 69, 85, 101, 117, 133, 149, 165, 181, 197, 213, 229, 245 |
| 6 |  |  |  |  |  |  |  |  |  |  | y |  |  |  |  |  |  | 6, 22, 38, 54, 70, 86, 102, 118, 134, 150, 166, 182, 198, 214, 230, 246 |
| 7 |  |  |  |  |  |  |  |  |  | y |  |  |  |  |  |  |  | 7, 23, 39, 55, 71, 87, 103, 119, 135, 151, 167, 183, 199, 215, 231, 247 |
| 8 |  |  |  |  |  |  |  |  | y |  |  |  |  |  |  |  |  | 8, 24, 40, 56, 72, 88, 104, 120, 136, 152, 168, 184, 200, 216, 232, 248 |
| 9 |  |  |  |  |  |  |  | y |  |  |  |  |  |  |  |  |  | 9, 25, 41, 57, 73, 89, 105, 121, 137, 153, 169, 185, 201, 217, 233, 249 |
| 10 |  |  |  |  |  |  | y |  |  |  |  |  |  |  |  |  |  | 10, 26, 42, 58, 74, 90, 106, 122, 138, 154, 170, 186, 202, 218, 234, 250 |
| 11 |  |  |  |  |  | y |  |  |  |  |  |  |  |  |  |  |  | 11, 27, 43, 59, 75, 91, 107, 123, 139, 155, 171, 187, 203, 219, 235, 251 |
| 12 |  |  |  |  | y |  |  |  |  |  |  |  |  |  |  |  |  | 12, 28, 44, 60, 76, 92, 108, 124, 140, 156, 172, 188, 204, 220, 236, 252 |
| 13 |  |  |  | y |  |  |  |  |  |  |  |  |  |  |  |  |  | 13, 29, 45, 61, 77, 93, 109, 125, 141, 157, 173, 189, 205, 221, 237, 253 |
| 14 |  |  | y |  |  |  |  |  |  |  |  |  |  |  |  |  |  | 14, 30, 46, 62, 78, 94, 110, 126, 142, 158, 174, 190, 206, 222, 238, 254 |
| 15 |  | y |  |  |  |  |  |  |  |  |  |  |  |  |  |  |  | 15, 31, 47, 63, 79, 95, 111, 127, 143, 159, 175, 191, 207, 223, 239, 255 |
| 16 | y |  |  |  |  |  |  |  |  |  |  |  |  |  |  |  |  | 16, 32, 48, 64, 80, 96, 112, 128, 144, 160, 176, 192, 208, 224, 240, 256 |

"y" means the connection is selected (the switch closed)

The first column with heading "Local Wiper Step No." indicates the groups (in rows) that may be accessed by the Wiper tapping points. The corresponding wiper tapping points are given for each row in column 2. The accessible Wiper Step Numbers are given in column 3. For instance, group 3 may be accessed, when W13 is selected, and step 3, 19, 35, 51, 67, 83, 99, 115, 131, 147, 163, 179, 195, 211, 227, or 243 may be set at the wiper depending on the A-B pair selection. In general, the Wiper Step Numbers is the sum of 16×(16−A-B pair tapping position) and Wiper Local Step number.

Within the specific scheme described above, the values of $r_0$ to $r_{15}$ may be set accordingly as follows:

TABLE 4

| Resistor | Value |
|---|---|
| R | Resistance of unit resistor |
| (R − $r_0$) | Resistance of end-resistors of W-section |
| $r_0$ | Fraction of R |
| $r_1$ | $r_0*[(1 - r_0/(16R))]$ |
| $r_2$ | $r_0*[(1 - r_0/(32R))]$ |
| $r_3$ | $r_0*[(1 - r_0/(48R))]$ |
| $r_4$ | $r_0*[(1 - r_0/(64R))]$ |
| $r_5$ | $r_0*[(1 - r_0/(80R))]$ |
| $r_6$ | $r_0*[(1 - r_0/(96R))]$ |
| $r_7$ | $r_0*[(1 - r_0/(112R))]$ |
| $r_8$ | $r_0*[(1 - r_0/(128R))]$ |
| $r_9$ | $r_0*[(1 - r_0/(144R))]$ |
| $r_{10}$ | $r_0*[(1 - r_0/(160R))]$ |
| $r_{11}$ | $r_0*[(1 - r_0/(176R))]$ |
| $r_{12}$ | $r_0*[(1 - r_0/(192R))]$ |
| $r_{13}$ | $r_0*[(1 - r_0/(208R))]$ |

TABLE 4-continued

| Resistor | Value |
|---|---|
| $r_{14}$ | $r_0*[(1 - r_0/(224R))]$ |
| $r_{15}$ | $r_0*[(1 - r_0/(240R))]$ |

These values are chosen, so that the resistances from A-end to the wiper tapping position and from wiper tapping position to B-end will be multiples of R.

3. Step Change

To change from one step to the next, the connecting point may be moved up or step down the tapping points one step a time in the wiper connection section. To avoid voltage spike in the output, the switch to the target point is first closed, then the switch to the starting point is open.

4. Range Change

When the limits of connecting points, W_0 and W_16, are reached, then a new A-B pair needs to be switched in and the connecting point in the W sections to be moved to the opposite limits. This Range Change requires moving A-end and B-end connection from one A-B pair tapping points to the next. Smooth range change may be achieved, if internal nodes, called effective tapping points, between the original tapping point and the target tapping point can be reached effectively by adjusting the resistance of the associated switches.

Figure 5:
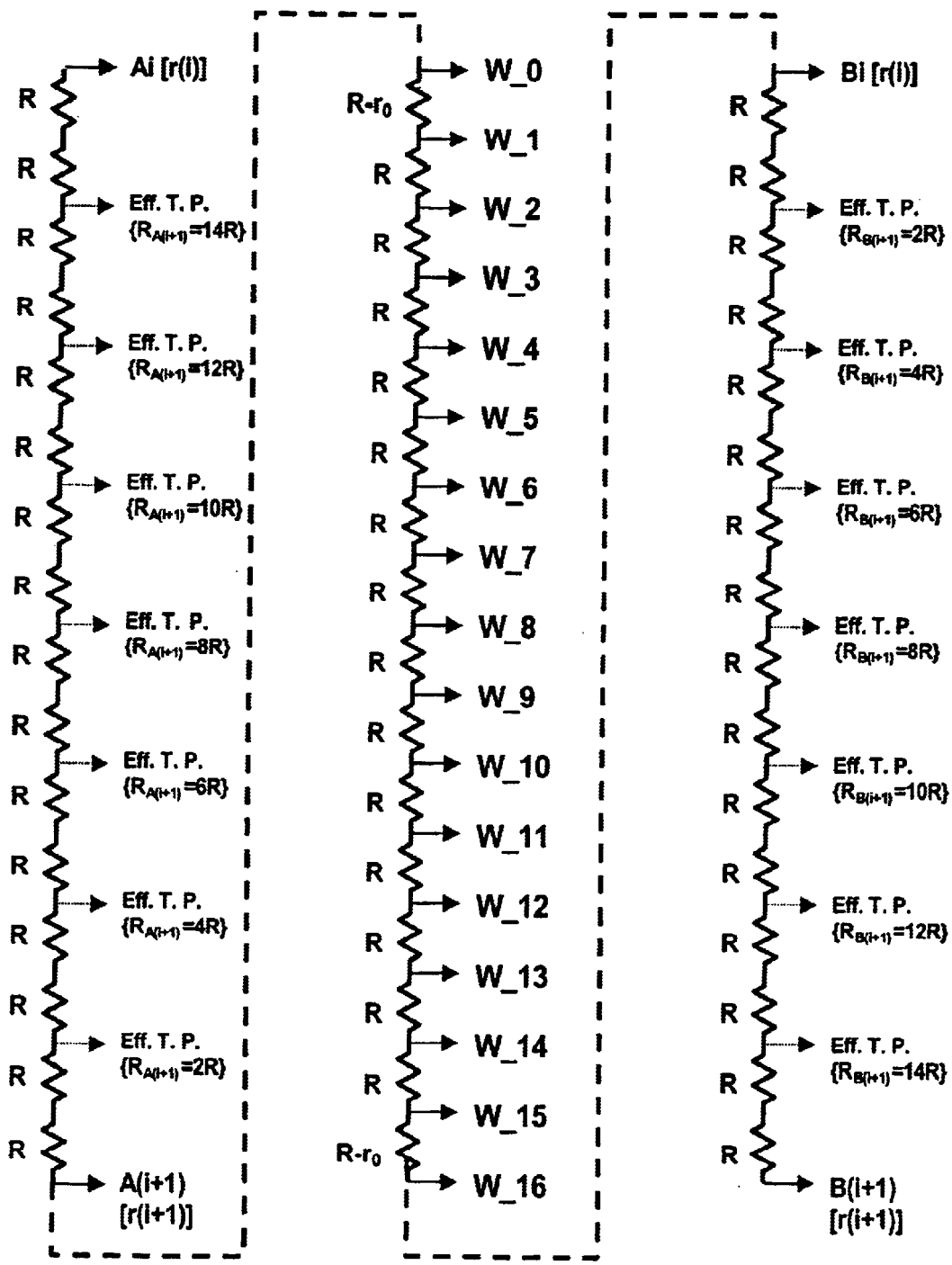
FIG. 5 shows a range change system, dubbed "A-W-B" as implemented for a potentiometer with 256 equally discernible steps, according to one embodiment of the invention.

This is depicted in FIG. 5 for a system with 16 fine steps (W-section). Seven effective tapping points have been added between the tapping points (solid arrows) of A(i) and A(i+1), and B(i) and B(i+1), to represent where the A-end and B-end terminals may effectively tap into the resistor string by controlling the resistance of the associated switches appropriately. Depending on the design of the switches (such as control, gate drive, etc.), more or less effective tapping points may be created, or may even be made continuous.

Using the system above, and assuming substantially all of the effective tapping points are assessable, the operation of range change may be conducted as follows:

4.1 Change from Pair A(i)-B(i) to Pair A(i+1)-B(i+1)

This is so called the "range move down" (or moving towards B-end) case. A sequence of operations is defined as follows. 1) Initial condition: A-end terminal is connected to A(i). Wiper terminal is connected to W_0. B-end terminal is connected to B(i). 2) Connect B-terminal to B(i+1). {Switch fully on}, while keep the connection to B(i). 3) Turn Switch A(i+1) partially on, such that A-end is effectively connected to Eff. {T.P. Ra=14R}. 4) Connect W-terminal to W_1. Then release the connection to W_0. 5) Turn Switch B(i) partialy off, such that B-end is effectively connected to Eff. {T.P. Rb=2R}. 6) Connect W-terminal to W_2. Then release the connection to W_1. 7) Turn Switch A(i+1) on more, such that A-end is effectively connected to Eff. {T.P. Ra=12R}. 8) Connect W-terminal to W_2. Then release the connection to W_1. 9) Turn Switch B(i) off, such that B-end is effectively connected to Eff. {T.P. Rb=4R}. 10) Connect W-terminal to W_3. Then release the connection to W_2. 11) In this manner, the steps similar to 3) through 6) are repeatedly applied, such that A-end terminal is effectively connected to Eff. (T.P. Ra=2R) Wiper terminal is connected to W_14. B-end terminal is effectively connected to Eff. (T.P. Rb=14R} Finally, the A(i+1)-B(i+1) may be reached. 12) Turn Switch A(i+1) fully on. Then release the connection to A(i). 13) Connect W-terminal to W_15. Then release the connection to W_14. 14) Turn Switch B(i) fully off, such that B-end is only connected to B(i+1). 15) Connect W-terminal to W_16. Then release the connection to W_15.

Figure 6:
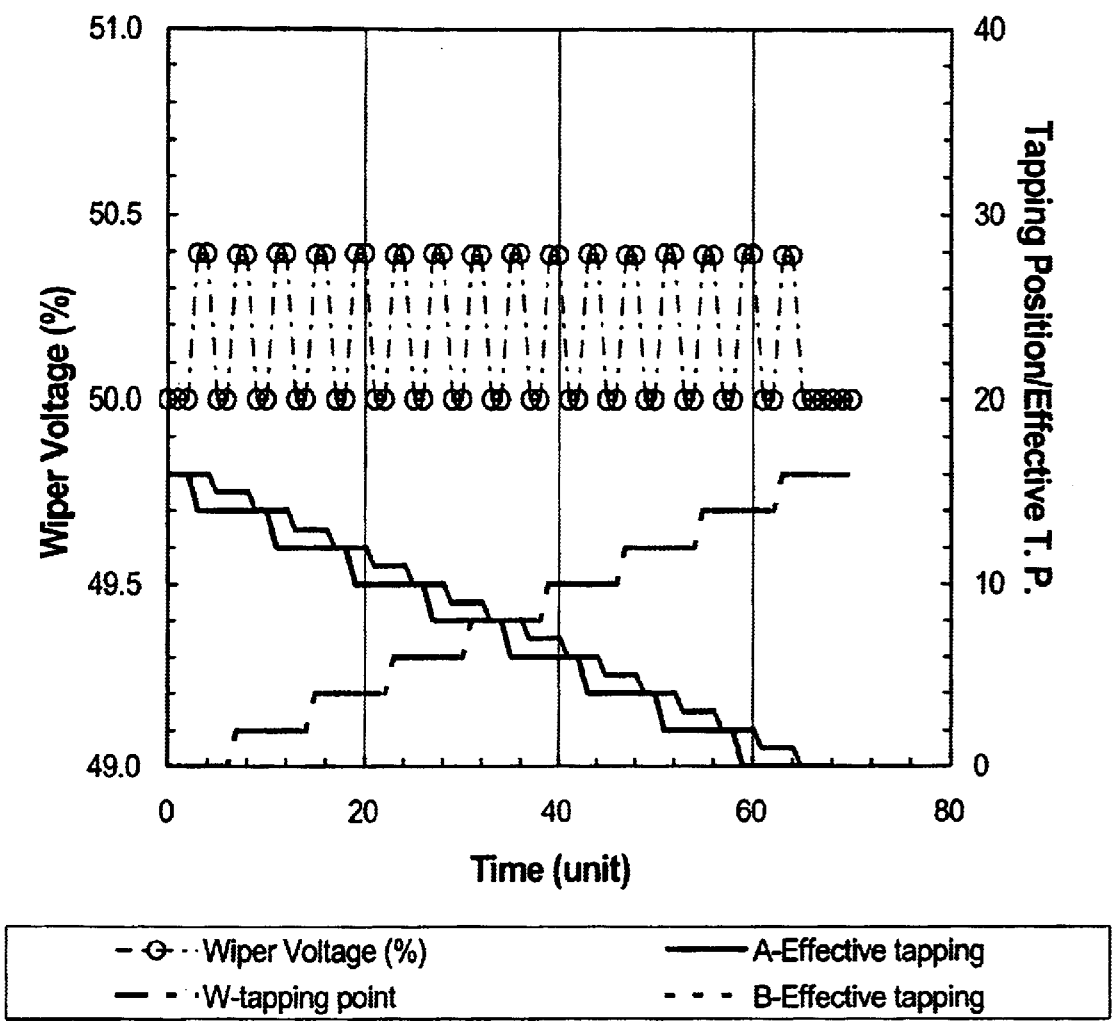
FIG. 6 illustrates a "range move down" simulation according to an embodiment of the invention.

The simulation (not include the capacitance effect) of "range move down" is shown in FIG. 6.

4.2 Change from Pair the A(i+1)-B(i+1) to Pair A(i)-B(i)

This is so called the "range move up" (or moving towards A-end) case. This may be done in a similar fashion as in section 4.1, but reversing the role of A (switches, effective T. P . . . ) and B.

4.3 Switch Resistance and Conductance

The resistance value of the switch may be calculated for the target effective tapping points. Thus, for the example case, 1. The A(i+1) Switch

TABLE 5A

The variable Switch Resistance {A(i + 1)}

| Effective T.P. | Resultant Resistance | Switch Resistance [a] | Switch Conductance [a] |
|---|---|---|---|
| {Ra(i + 1) = 14R} | 14 | 112.0 | 0.0089 |
| {Ra(i + 1) = 12R} | 12 | 48.0 | 0.0208 |
| {Ra(i + 1) = 10R} | 10 | 26.7 | 0.0375 |
| {Ra(i + 1) = 8R} | 8 | 16.0 | 0.0625 |
| {Ra(i + 1) = 6R} | 6 | 9.6 | 0.1042 |
| {Ra(i + 1) = 4R} | 4 | 5.3 | 0.1875 |
| {Ra(i + 1) = 2R} | 2 | 2.3 | 0.4375 |

2. The B(i) Switch

TABLE 5B

The variable Switch Resistance {B(i)}

| Effective T.P. | Resultant Resistance | Switch Resistance | Conductance |
|---|---|---|---|
| {Ra(i + 1) = 2R} | 2 | 2.3 | 0.4375 |
| {Ra(i + 1) = 4R} | 4 | 5.3 | 0.1875 |
| {Ra(i + 1) = 6R} | 6 | 9.6 | 0.1042 |
| {Ra(i + 1) = 8R} | 8 | 16.0 | 0.0625 |
| {Ra(i + 1) = 10R} | 10 | 26.7 | 0.0375 |
| {Ra(i + 1) = 12R} | 12 | 48.0 | 0.0208 |
| {Ra(i + 1) = 14R} | 14 | 112.0 | 0.0089 |

5. General Solution

In this architecture, a potentiometer is organized in ranges of equal distance, and fine steps of equal space. Explicitly, if the total number of programmable steps of the potentiometer is N, then N equals L times M, where L is the number of range unit and M is the number of fine steps. Moreover, there should be (L−1) units of resistors in A section, (L−1) units in B section and M units in W section with unit resistance equal to LR, LR, and R, respectively. Accordingly, the total number of switches is 2×(L−1)+M+1. To minimize the number of switches, L_min should be equal to $$\sqrt{\frac{N}{2}}.$$

Since only the integer is allowed as solution and N/L-min also has to be an integer, the solutions in L for minimal number of switches will be something close to √(N/2), and may come in pairs. An example of a 256-step potentiometer solution is shown below.

TABLE 6

The Solution for Minimum Number of Switches in the case of 256 steps

| Number of Range units L | Number of resistor units in W M | Number of switches 2 × (L − 1) = M = 1 |
|---|---|---|
| 4 | 64 | 71 |
| 8 | 32 | 47 |
| 16 | 16 | 47 |
| 32 | 8 | 71 |

What is claimed is:
1. An impedance network, comprising:
a plurality of impedance elements;
at least one end terminal;
a first plurality of switching elements selectively providing tap positions to the at least one end terminal, selectable at a first specified increment of impedance elements in the plurality of impedance elements; a wiper terminal;
a second plurality of switching elements selectively providing a tap positions to the wiper terminal, selectable at a second specified increment of impedance elements in the plurality of impedance elements; and
a third plurality of switching elements selectively providing tap positions to the wiper terminal, selectable at a second specified increment of impedance elements in the plurality of impedance elements to substantially reduce the direct connection of the first plurality of switching elements to the at least one terminal.

2. An impedance network, comprising:

a plurality of impedance elements;

at least one end terminal;

a first plurality of switching elements selectively providing tap positions to the at least one end terminal, selectable at a first specified increment of impedance elements in the plurality of impedance elements;

a wiper terminal;

a second plurality of switching elements selectively providing a tap positions to the wiper terminal, selectable at a second specified increment of impedance elements in the plurality of impedance elements; and a third plurality of switching elements selectively providing tap positions to the wiper terminal, selectable at a third specified increment of impedance elements in the plurality of impedance elements to substantially reduce the direct connection of the first plurality of switching elements to the at least one terminal.

3. The network of claim 2, wherein the third specified increment is smaller than the second increment.

4. A method for configuring an impedance network, comprising:

providing a plurality of impedance elements;

providing at least one end terminal and a wiper terminal;

first selectively providing tap positions to the at least one end terminal, selectable at a first specified increment of impedance elements in the network;

second selectively providing a tap positions to the wiper terminal, selectable at a second specified increment of impedance elements in the network; and third selectively providing tap positions to the wiper terminal, selectable at a third specified increment to protect the at least one end terminal.

* * * * *